United States Patent
Koizumi et al.

(10) Patent No.: US 6,370,027 B1
(45) Date of Patent: Apr. 9, 2002

(54) SEMICONDUCTOR MODULE AND HEAT SINK USED IN SUCH MODULE

(75) Inventors: Shoji Koizumi; Hiroyuki Komatsu, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/925,706

(22) Filed: Aug. 10, 2001

Related U.S. Application Data (62) Division of application No. 09/438,408, filed on Nov. 12, 1999, now Pat. No. 6,297,961.

(30) Foreign Application Priority Data

Nov. 13, 1998 (JP) ............................................ 10-323674

(51) Int. Cl.[7] .................................................. H05H 7/20
(52) U.S. Cl. ...................... 361/720; 165/80.3; 165/185; 174/16.3; 257/719
(58) Field of Search ............................... 165/80.2, 80.3, 165/185; 174/16.3; 257/718–719, 726–727; 361/704, 707, 709–711, 715, 719–721

(56) References Cited

U.S. PATENT DOCUMENTS

| 4,646,203 A | 2/1987 | Ngo et al. |
| 5,272,599 A | 12/1993 | Koenan |
| 5,414,592 A | 5/1995 | Stout et al. |
| 5,671,122 A | 9/1997 | Schoetti et al. |
| 5,926,371 A | 7/1999 | Dolbear |

*Primary Examiner*—Gregory Thompson
(74) *Attorney, Agent, or Firm*—Staas & Halsey LLP (57) ABSTRACT

A semiconductor module includes a circuit board provided with a plurality of attachment holes and semiconductor elements or semiconductor devices mounted on the circuit board and a pair of metallic plates. The circuit board is disposed, between the pair of metallic plates, in such a manner that spaces are defined between the circuit board and the pair of metallic plates for accommodating the semiconductor elements or semiconductor devices when the pair of metallic plates are attached to the circuit board. One of the metallic plates is provided at positions corresponding to the attachment holes with through holes and the other metallic plate is provided at positions corresponding to the attachment holes with tubular projections having a length larger than a sum of a thickness of the circuit board and a thickness of the one metallic plate. The tubular projections are inserted into the attachment holes and the through holes and tip ends of the tubular projections are enlarged to firmly attach the pair of metallic plates to the circuit board.

11 Claims, 10 Drawing Sheets

SEMICONDUCTOR MODULE AND HEAT SINK USED IN SUCH MODULE

This application is a divisional of application Ser. No. 09/438,408, filed Nov. 12, 1999, now allowed as U.S. Pat. No. 6,297,961.

BACKGROUND OF THE INVENTION

1. Field of the Invention

The present invention relates to a semiconductor module, particularly to a heat sink for a semiconductor module used as an extended or expanded memory module in a personal computer or the like. Also, the present invention relates to a semiconductor module in which the above-mentioned heat sink for a semiconductor module is incorporated.

2. Description of the Related Art

First, the structure of a semiconductor module, especially that generally used as an extended or expanded memory module in a personal computer or the like, will be described with reference to FIG. 14.

A memory module 10 is comprised of a circuit board 12 having a plurality of terminals 11 formed along an edge thereof, and a plurality of semiconductor memories 14 mounted on both surfaces of the circuit board 12. The semiconductor memory 14 may be mounted in various ways. For example, a memory element (memory chip) itself which is a semiconductor element is directly carried on the circuit board by a flip-chip method or others, or the memory element may be packaged with resinous material together with a lead frame to form a semiconductor device which is then mounted onto the circuit board. Alternatively, the semiconductor memory may be of a chip-size package type such as μ BGA.

Figure 15:
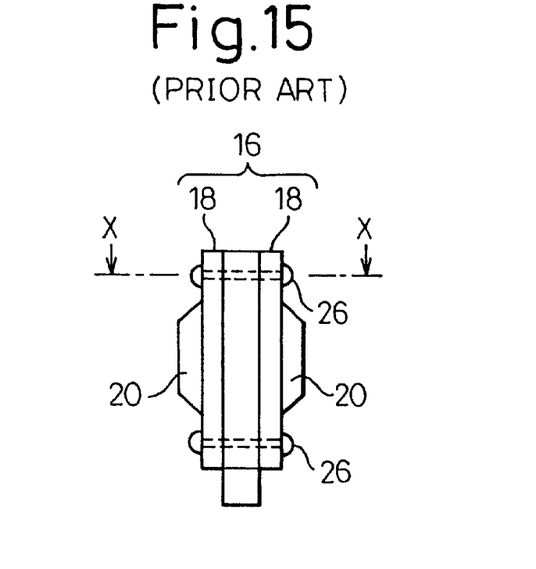
FIG. 15 is a side view of the memory module on which the heat sink shown in FIG. 14 is attached.
Figure 16:
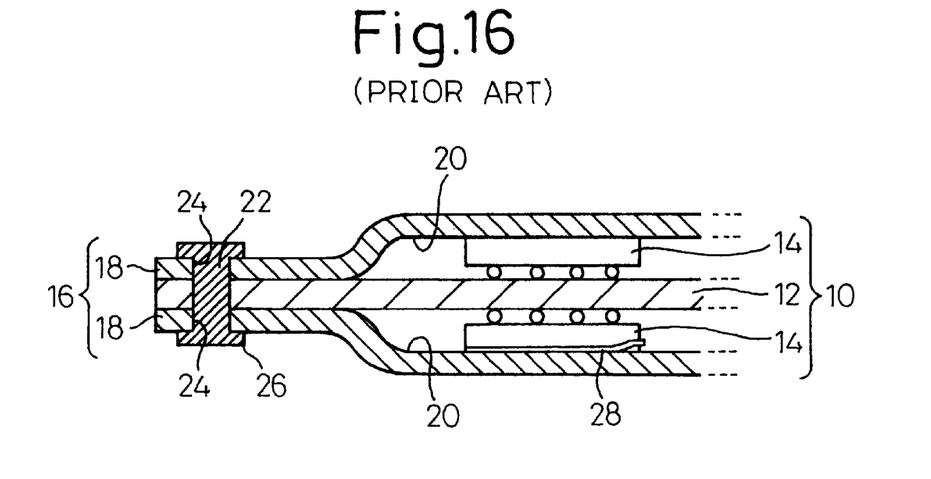
FIG. 16 is a sectional view of a main part shown in FIG. 15 taken along a line X—X.

Next, a structure of a prior art heat sink used in this memory module 10 as well as an attachment structure therefor will be described with reference to FIGS. 14 to 16.

A heat sink 16 is constructed by a pair of metallic plates 18, each formed to have a generally rectangular contour similar to that of the circuit board 12 and have a size sufficient for covering an overall area in the circuit board 12 mounting the semiconductor memories 14 thereon. A recess 20 is formed in the respective metallic plate 18, having dimensions capable of receiving the semiconductor memory 14 of a certain thickness attached to the surface of the circuit board 12 so that an inner surface of the metallic plate 18 is brought into close contact with a back surface of the semiconductor memory 14 when the metallic plates 18 is brought into close contact with the both sides of the circuit board 12, respectively.

The heat sink 16 is attached to the circuit board 12 while using a plurality of through-holes 24 provided at positions corresponding to a plurality of (e.g. four) attachment holes 22 provided in the circuit board 12.

The heat sinks 16 are arranged on the respective sides of the memory module 10 so that all of the through-holes 24 provided in the respective heat sink are aligned with the respective attachment holes corresponding thereto.

Then, a rivet 26 is inserted into the through-hole 24 of the heat sink 16 and the attachment hole 22 thus aligned to each other, while protecting opposite ends of the rivet 26 out of the holes 22, 24. The projected ends are hammered to have a larger diameter. Thereby, the heat sinks 16 are attached to the both surfaces of the memory module 10.

However, there is a problem when the heat sinks 16 are attached to the memory module 10 in the above-mentioned manner, in that the operation is extremely troublesome, for bringing the heat sinks 16 into close contact with the circuit board 12 of the memory module 10 via a tape 28 while positioning the through-holes 24 to the attachment holes 22 corresponding thereto and inserting the rivets 26 one by one into the respective through-holes 24 aligned with the attachment holes 22, after which the projected ends of the rivet are hammered to secure the heat sink 16 to the memory module 10.

This is because there is no positioning mechanism between the circuit board 12 and the heat sink 16, whereby the alignment between both the holes is liable to be disturbed, by a trifling cause, to prevent the rivets 26 from being inserted.

SUMMARY OF THE INVENTION

Accordingly, the present invention has been made to solve the above-mentioned problem in the prior art, and an object thereof is to provide a heat sink for a semiconductor module capable of being easily attached to the semiconductor module.

Another object of the present invention is to provide a semiconductor module on which the heat sink for a semiconductor module is mounted.

According to the present invention, there is provided a heat sink adapted to be used for a semiconductor module, the heat sink comprising: a pair of metallic plates, between which a circuit board having attachment holes is to be disposed, in such a manner that spaces are defined between the circuit board and the pair of metallic plates for accommodating semiconductor elements or semiconductor devices mounted on the circuit board, when the pair of metallic plates are attached to the circuit board; one of the metallic plates provided at positions corresponding to the attachment holes with through holes; the other metallic plate provided at positions corresponding to the attachment holes with tubular projections having a length larger than a sum of a thickness of the circuit board and a thickness of the one metallic plate; and the tubular projections capable of being inserted into the attachment holes and the through holes, and tip ends of the tubular projections capable of being enlarged so as to firmly attach the pair of metallic plates to the circuit board.

The tubular projections are integrally formed with the other metallic plate.

The pair of metallic plates are integrally connected to each other by means of a connecting portion having a width substantially the same as the thickness of the circuit board, so that the pair of metallic plates can be bent along the connecting portion so as to be attached to the circuit board.

Thin portions are provided at boundaries between the connecting portion and the metallic plates, so that the pair of metallic plates can easily be bent along the thin portions to be attached to the circuit board.

According to another aspect of the present invention, there is provided a heat sink adapted to be used for a semiconductor module, the heat sink comprising: a pair of same or symmetrical metallic plates, between which a circuit board having at least a pair of attachment holes is to be disposed, in such a manner that spaces are defined between the circuit board and the pair of metallic plates for accommodating semiconductor elements or semiconductor devices mounted on the circuit board, when the pair of metallic plates are attached to the circuit board; each of the metallic plates provided at a position corresponding to one of the attachment holes with a through holes and at a position corresponding to the other attachment hole with a tubular projection having a length larger than a sum of a thickness of the circuit board and a thickness of the metallic plate; and the tubular projections of the respective metallic plates capable of being inserted into the attachment holes and the through holes of the respective other metallic plates and tip ends of the tubular projections capable of being enlarged so as to firmly attached the pair of metallic plates to the circuit board.

According to still another aspect of the present invention, there is provided a heat sink adapted to be used for a semiconductor module, the heat sink comprising: a pair of metallic plates, between which a circuit board, having attachment holes, is to be disposed in such a manner that spaces are defined between the circuit board and the pair of metallic plates for accommodating semiconductor elements or semiconductor devices mounted on the circuit board, when the pair of metallic plates are attached to the circuit board; each of the metallic plates provided at positions corresponding to the attachment holes with through holes; the pair of metallic plates integrally connected to each other by means of a connecting portion having a width substantially same as the thickness of the circuit board; and thin portions provided at a boundary between the connecting portion and the metallic plates, so that the pair of metallic plates can easily be bent along the thin portions to be attached to the circuit board.

According to another aspect of the present invention, there is provided a semiconductor module comprising: a circuit board provided with a plurality of attachment holes; semiconductor elements or semiconductor devices mounted on the circuit board; a pair of metallic plates, as mentioned above.

The tip ends of the tubular projections are enlarged by hammering.

DETAILED DESCRIPTION OF THE EMBODIMENTS

The present invention will be described below in more detail with reference to the preferred embodiments of a heat sink for a semiconductor module according to the present invention shown in the attached drawings. In this regard, it should be noted that although the description is made on a heat sink used for a memory module, it is also applicable to semiconductor modules on which other semiconductors than that used for the memory are mounted.

(First Embodiment)

Figure 1:
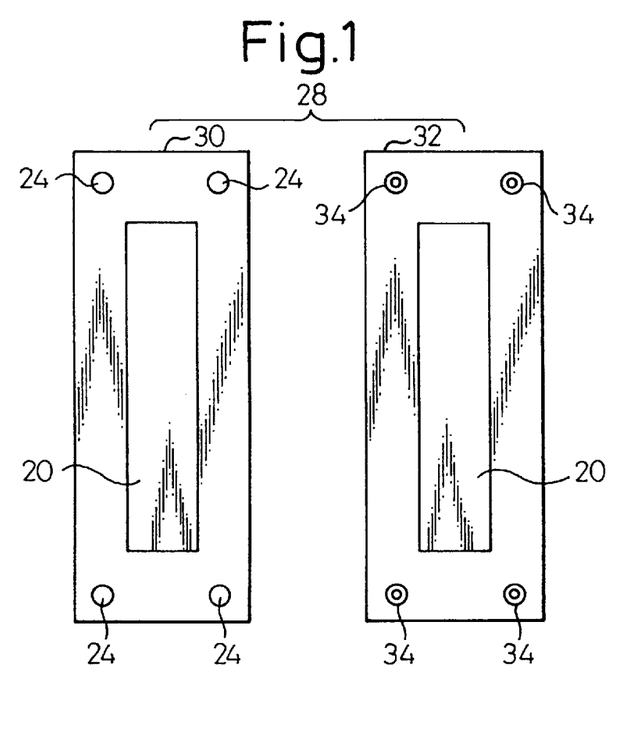
FIG. 1 is an illustration for explaining a structure of a pair of metallic plates forming a heat sink for a semiconductor module of a first embodiment according to the present invention.
Figure 2:
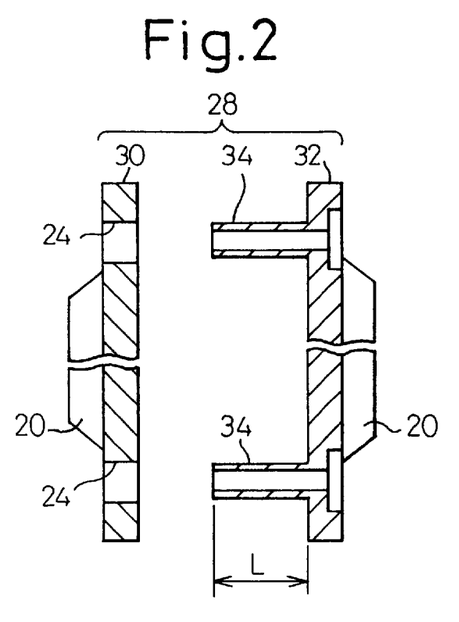
FIG. 2 is a sectional view for illustrating a main part of the pair of metallic plates forming the heat sink shown in FIG. 1.

First, a structure of a heat sink 28 for a memory module will be described with reference to FIGS. 1 to 3. Note that the components similar to those already described with reference to the prior art are designated by the same reference numerals and the detailed description thereof will be eliminated.

The heat sink 28 is formed of a pair of metallic plates 30, 32 wherein one metallic plate 30 is provided with a plurality of through-holes 24 at positions corresponding to attachment holes 22 of a circuit board 12 in a memory module 10.

While, the other metallic plate 32 has a plurality of tubular projections 34 at positions corresponding to the attachment holes 22. The respective projection 34 has a cross-sectional diameter insertable into the attachment hole 22 and the through-hole 24 and a length L longer than a sum of a thickness D1 of the circuit board 12 and a thickness D2 of the one metallic plate 30. The tubular projection 34 is formed integral with the other metallic plate 32 by a burring method to have an opening at a tip end.

Note that the metallic plates 30, 32 have the same thickness in this embodiment.

Next, the steps for attaching the respective metallic plates 30, 32 to the memory module 10 will be described with reference to FIGS. 3 and 4.

Figure 3:
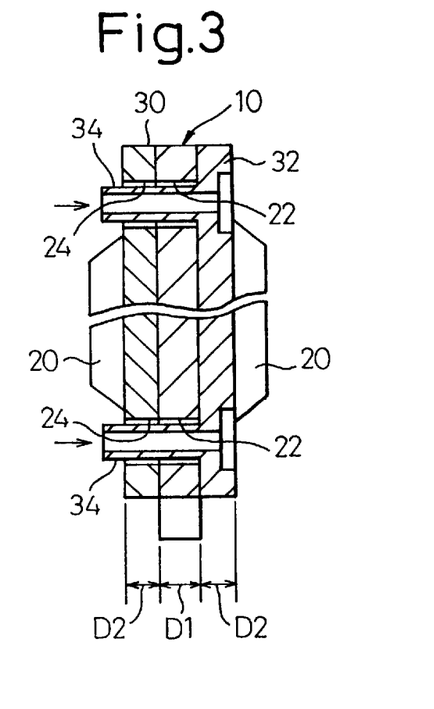
FIG. 3 is a sectional view for illustrating a main part of a structure for attaching the heat sink shown in FIG. 1 to a memory module.
Figure 4:
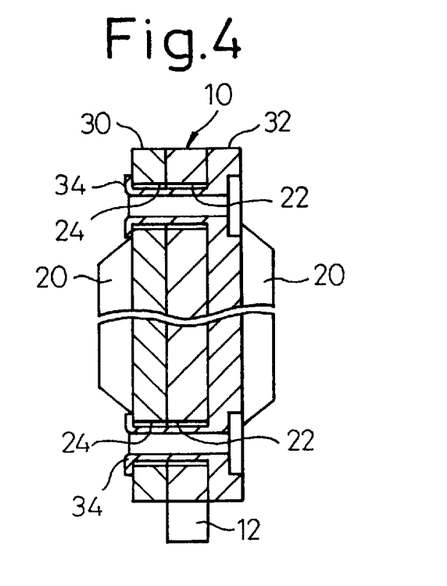
FIG. 4 is a sectional view for illustrating the memory module on which the pair of metallic plates are attached by hammering the projected end of a tubular projection shown in FIG. 3 to have a larger diameter.

At a first step, as shown in FIG. 3, the metallic plate 32 having the tubular projections 34 is brought into close contact with one side of the memory module 10 while inserting the respective tubular projections 34 into the attachment holes 22 of the circuit board 12. The circuit board 12 is positioned to the metallic plate 32 by the insertion of the tubular projections 34 into the attachment holes 22 of the circuit board 12, whereby the lateral shift of the circuit board 12 relative to the metallic plate 32 is prevented from occurring.

At a second step, a portion of the respective tubular projection 34 projected out of the attachment hole 22 of the circuit board 12 as shown in FIG. 3 is inserted into the respective through-holes 24 of the remaining metallic plate 30 so that the metallic plate 30 is brought into close contact with the other side of the memory module 10. The respective tubular projection 34 passes through the circuit board 12 and the metallic plate 30, and a tip end thereof projects out of the surface of the metallic plate 30. The circuit board 12 and the metallic plate 30 are positioned to the metallic plate 32 by the insertion of the tubular projections 34 into the attachment holes 22 and through-hole 24, respectively, whereby the lateral shift of the three plate members relative to each other is prevented from occurring.

At a third step, the end of the tubular projection 34 projected out of the surface of the metallic plate 32 is hammered in the arrowed direction to have a larger diameter, as shown in FIG. 3. Thus, the metallic plates 30, 32 forming the heat sink 16 for a memory module are secured to the memory module 10 as shown in FIG. 4. Since the three plate members (the two metallic plates 30, 32 and the circuit board 12) are prevented from laterally shifting relative to each other, the hammering operation of the tubular projection 34 is facilitated.

Also, this eliminates rivets to improve the workability in comparison with the conventional method known in the prior art.

(Second Embodiment)

Figure 5:
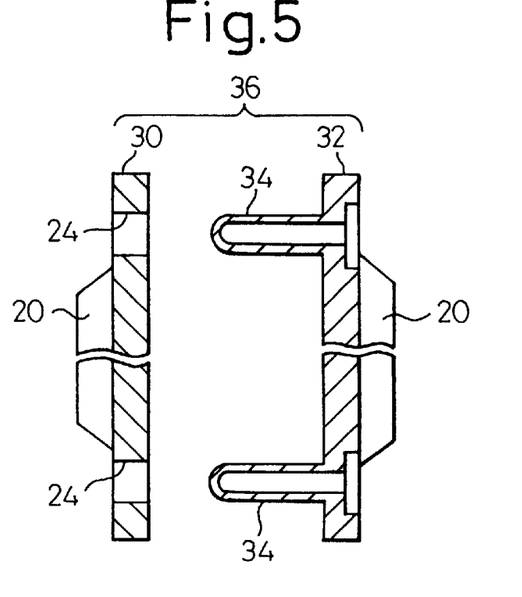
FIG. 5 is a sectional view for explaining a structure of a main part of a pair of metallic plates forming a heat sink for a semiconductor module of a second embodiment according to the present invention.

A basic structure of a heat sink for a memory module according to this embodiment is generally the same as that of the heat sink 28 for a memory module according to the first embodiment, except for the tubular projection 34. Therefore, the description will be made solely on the tubular projection 34, while denoting the other components with the same reference numerals as those used in the first embodiment and eliminating the detailed description thereof.

Since the tubular projection 34 of this embodiment is formed in integral with the other metallic plate 32 by forging, a tip end thereof is closed.

Figure 6:
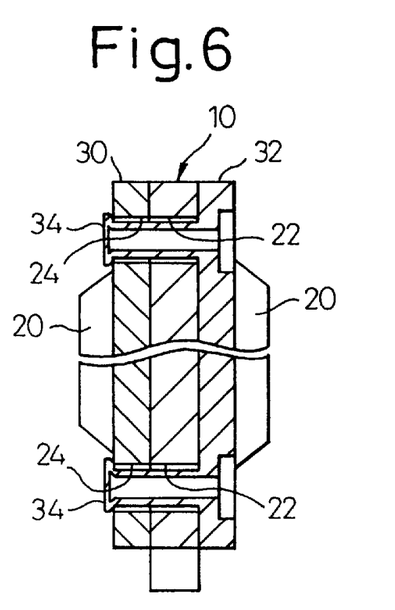
FIG. 6 is a sectional view for illustrating the memory module on which the pair of metallic plates are attached by hammering the projected end of a tubular projection shown in FIG. 5 to have a larger diameter.

The steps for attaching the respective metallic plates 30, 32 to the memory module 10 are also the same as those in the first embodiment. That is, the metallic plate 32 is first brought into close contact with one surface of the memory module 10 while inserting the projections 34 into the corresponding attachment holes 22 of the circuit board 12. Then, a portion of the respective tubular projection 34 projected out of the attachment hole 22 of the circuit board 12 is inserted into the through-hole 24 of the remaining metallic plate 30 so that the metallic plate 30 is brought into close contact with the other side of the memory module 10.

Finally, as shown in FIG. 6, a tip end of the tubular projection 34 projected out of the surface of the metallic plate 30 is hammered to have a larger diameter. Thereby, the metallic plates 30, 32 constituting the heat sink 36 for a memory module are attached to the memory module 10.

In this regard, although the close tip end of the tubular projection 34 may be directly hammered in the above-mentioned operation for enlarging the diameter thereof, it is preferable to provide in advance an aperture at the tip end of the tubular projection 34 so that the tip end is evenly deformed.

(Third Embodiment)

In each of the heat sinks 28 and 36 for a memory module disclosed in the preceding embodiments, the metallic plates 30 and 32 have different structures from each other, which means that two kinds of dies are necessary for the preparation thereof.

The heat sink for a memory module according to this embodiment is characterized in that, for the purpose of reducing the production cost, a pair of metallic plates are identical in shape by using one kind of die for the preparation thereof.

A structure of such a heat sink 38 as described above will be explained with reference to FIGS. 7 to 9.

Figure 7:
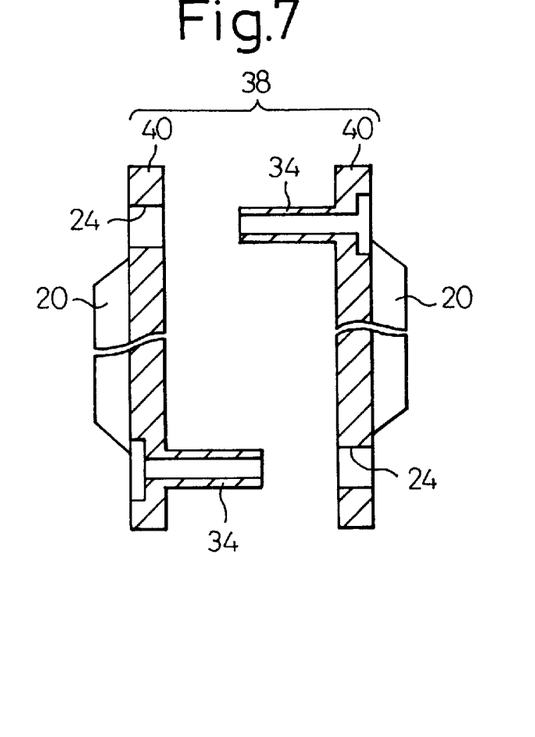
FIG. 7 is a sectional view for explaining a structure of a main part of a pair of metallic plates forming a heat sink for a semiconductor module of a third embodiment according to the present invention.
Figure 8:
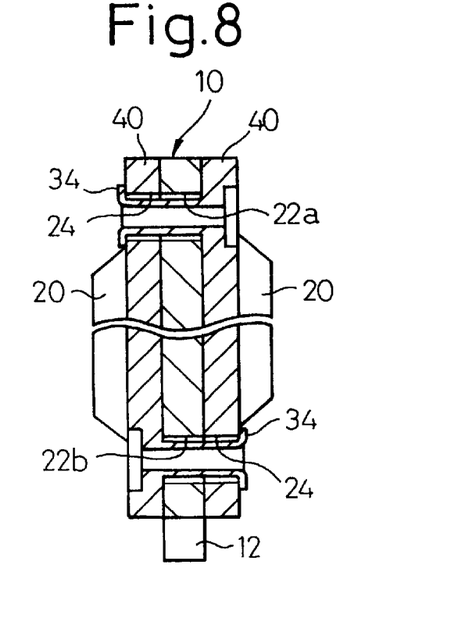
FIG. 8 is a sectional view for illustrating a main part of a structure for attaching the heat sink shown in FIG. 7 to a memory module (wherein the pair of metallic plates are attached to the memory module by hammering the projected end of a tubular projection to have a larger diameter.

Each of a pair of metallic plates 40 constituting the heat sink 38 has two through-holes 24 and two tubular projections 34 diagonally arranged opposite to each other. Positions at which the through-holes 24 and the tubular projections 34 are formed are symmetrical about a center line CL so that, when one metallic plate 40 is disposed on one side of a memory module 10 and the other metallic plate 40 is disposed on the other side of the memory module 10 while turning inside out about the center line CL, the tubular projections 34 formed in the one metallic plate 40 are positioned in correspondence to the through-holes 24 formed in the other metallic plate 40, as shown in FIG. 8. The tubular projection 34 may be formed by a burring method or forging.

The above-mentioned positional relationship between the through-holes 24 and the tubular projections 34 in the heat sink 38 will be described in more detail below, assuming that the pair of metallic plates 40, 40 are disposed on the opposite sides of the circuit board 12 (or the memory module 10). In this respect, the number of attachment holes 22 provided in the circuit board 12 is an even number.

The pair of metallic plates 40, 40 are formed to have an identical and symmetrical shape, respectively. In one metallic plate 40 (to be disposed on the righthand side of the memory module 10 as seen in FIG. 8), the through-holes 24 are provided at positions corresponding to one group 22a of the attachment holes 22, and the tubular projections 34 are provided at positions corresponding to the other group 22b of the attachment holes 22, each of the projections being insertable into the attachment hole 22b and the through-hole 24 provided in the other metallic plate 40 (to be disposed on the lefthand side of the memory module 10 as seen in FIG. 8) and having a length longer than a sum of a thickness of the circuit board 12 and a thickness of the other metallic plate 40 (which is the same as that of the one metallic plate 40). On the other hand, in the other metallic plate 40, the tubular projections 34 are provided at positions corresponding to the one group 22a of the attachment holes 22, each of the projections being insertable into the attachment hole 22a and the through-hole 24 provided in the one metallic plate 40 and having a length longer than a sum of a thickness of the circuit board 12 and a thickness of the one metallic plate 40, and the through-hole 24 are provided at positions corresponding to the other group 22b of the attachment holes 22.

Figure 14:
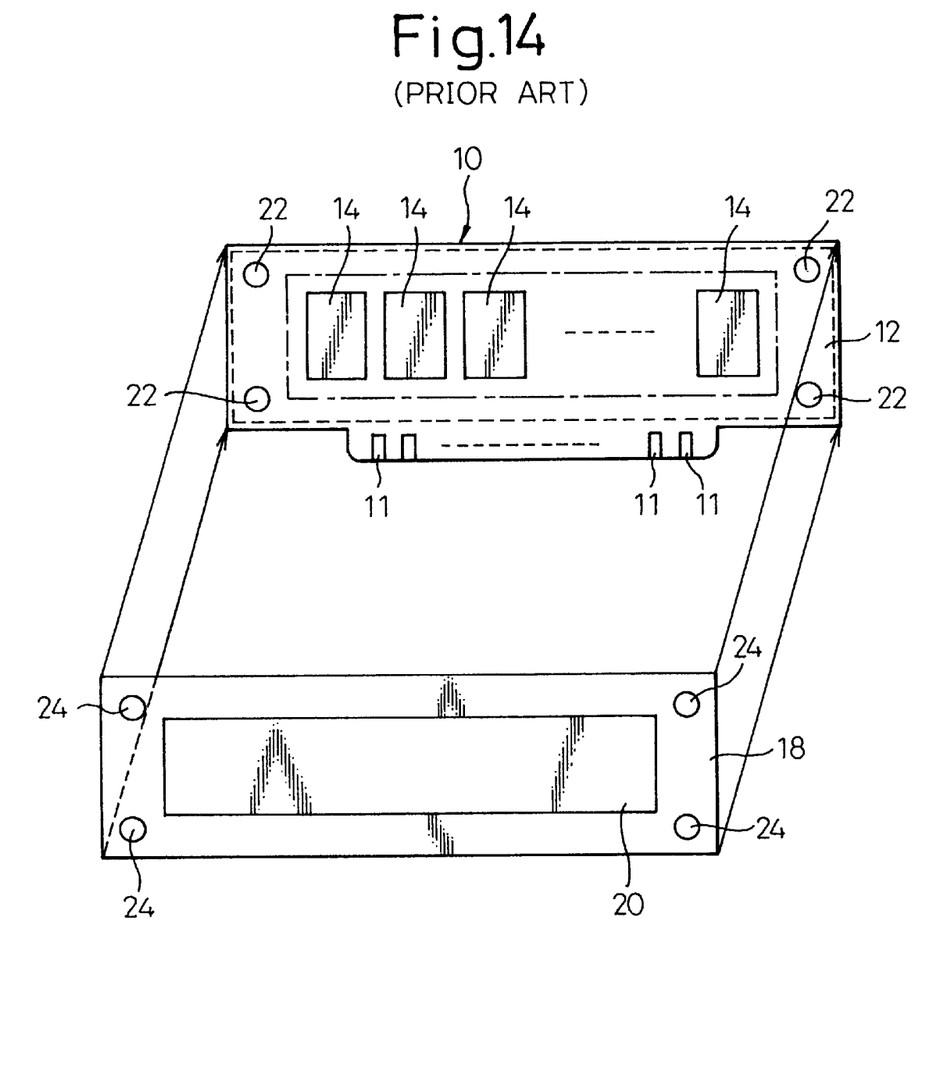
FIG. 14 is an illustration for explaining a conventional structure for attaching a heat sink to a semiconductor module.

Since the attachment holes 22 provided in the circuit board 12 are arranged, for example, at two pairs of diagonal positions as shown in FIG. 14, the above-mentioned one group 22a of the attachment holes correspond to two attachment holes arranged at one diagonal positions and the other group 22b of the attachment holes correspond to two attachment holes arranged at the other diagonal positions.

The attachment steps are the same as in the first and second embodiments. That is, one metallic plate 40 is brought into close contact with one side of the memory module 10 while inserting the tubular projections 34 thereof into the corresponding attachment holes 22 in the circuit board 12. Thus, the through-holes 24 of this metallic plate 40 are also aligned with the attachment holes 22 of the circuit board 12.

Then, a portion of the respective tubular projection 34 projected out of the attachment hole 22 of the circuit board 12 is inserted into the through-hole 24 of the remaining metallic plate 40 to bring this metallic plate 40 into close contact with the other side of the memory module 10. At the same time, the tubular projections provided in this metallic plate 40 are inserted into the attachment holes 22 of the circuit board 12 with the tip ends thereof projecting out of the through-holes 24 of the metallic plate 40 initially attached to the memory module 10.

Figure 9:
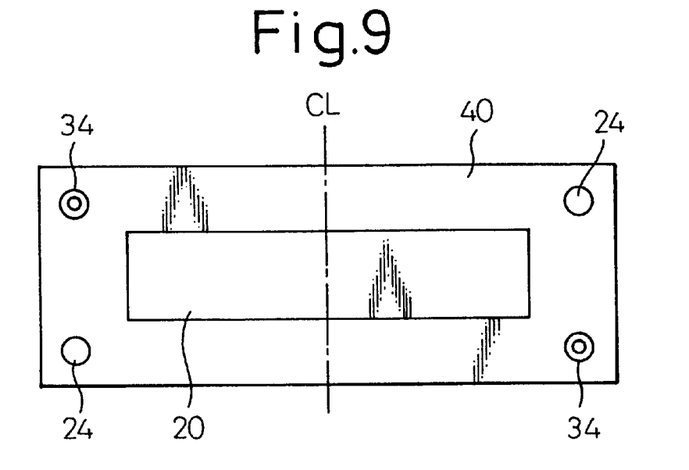
FIG. 9 is a plan view of the heat sink shown in FIG. 7.

Thereafter, the tip ends of the tubular projections 34 projected out of the respective metallic plates 40 are hammered to have a larger diameter, whereby the two metallic plates 40 are mounted to the memory module 10 as shown in FIG. 9.

In this regard, the operation and the effect of this arrangement are the same as in the first and second embodiments.

(Fourth Embodiment)

First, a heat sink 42 for a memory module will be explained below.

Figure 10:
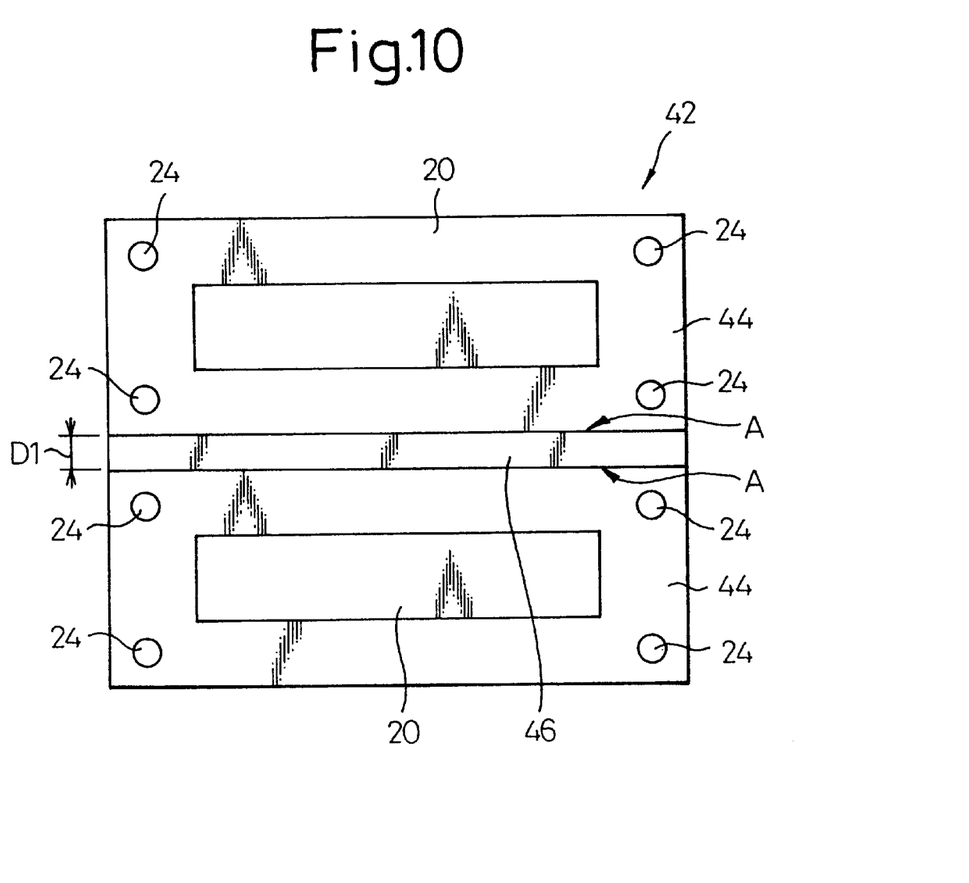
FIG. 10 is an illustration for explaining a structure of a pair of metallic plates forming a heat sink for a semiconductor module of a fourth embodiment according to the present invention.

While the pair of metallic plates constituting the heat sink are separately formed in the preceding embodiments, the heat sink 42 according to this embodiment is constituted by a pair of metallic plates 44, 44 to be disposed on the opposite sides of the memory module 10, which are integrally coupled to each other as shown in FIG. 10 via a joint portion 46 having the same thickness D1 and length as those of the circuit board 12. Thin-walled portions A capable of being linearly bent are provided in the boundary areas between the joint portion 46 and the respective metallic plates 44 and extend along edges of the joint portion 46.

Positions of through-holes 24 formed in the respective metallic plate 44 correspond to those of attachment holes 22 formed in the circuit board 12. The through-holes 24 in one metallic plate 44 are arranged in symmetry with those in the other metallic plate 44 about a center line of the joint portion 46.

The heat sink 42 described above may be prepared from a single sheet by a punching with a die, during which the thin-walled portions A are simultaneously formed in the boundary areas between the joint portion 46 and the respective metallic plates 44 to facilitate production.

Figure 12A:
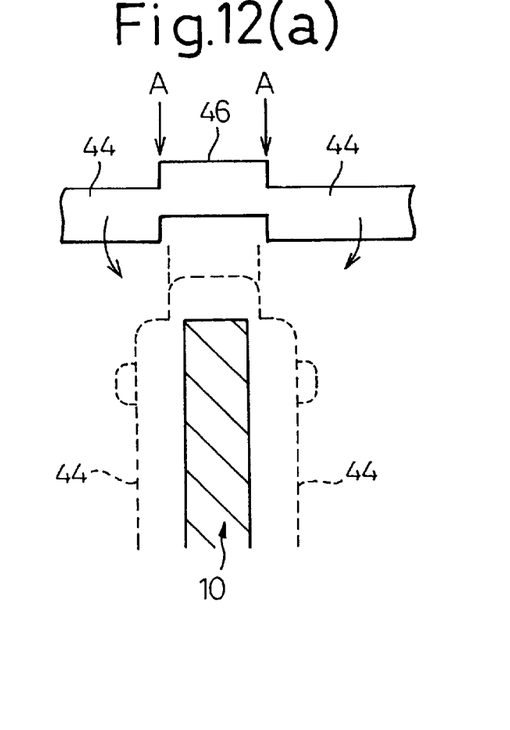
FIGS. 12(a) and 12(b) are illustrations of a thin-walled structure shown in FIG. 10; i.e., a half cut structure and a V-shaped notch structure, respectively.
Figure 12B:
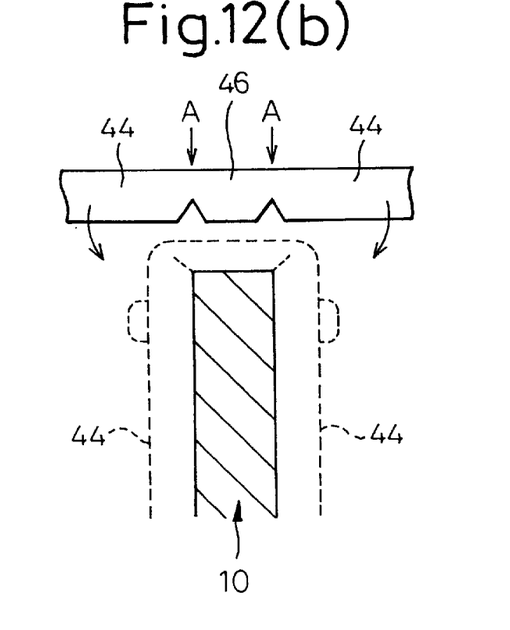

The thin-walled portion A may be of a half-cut structure as shown in FIG. 12(a) or a V-shaped notch structure as shown in FIG. 12(b).

Figure 11:
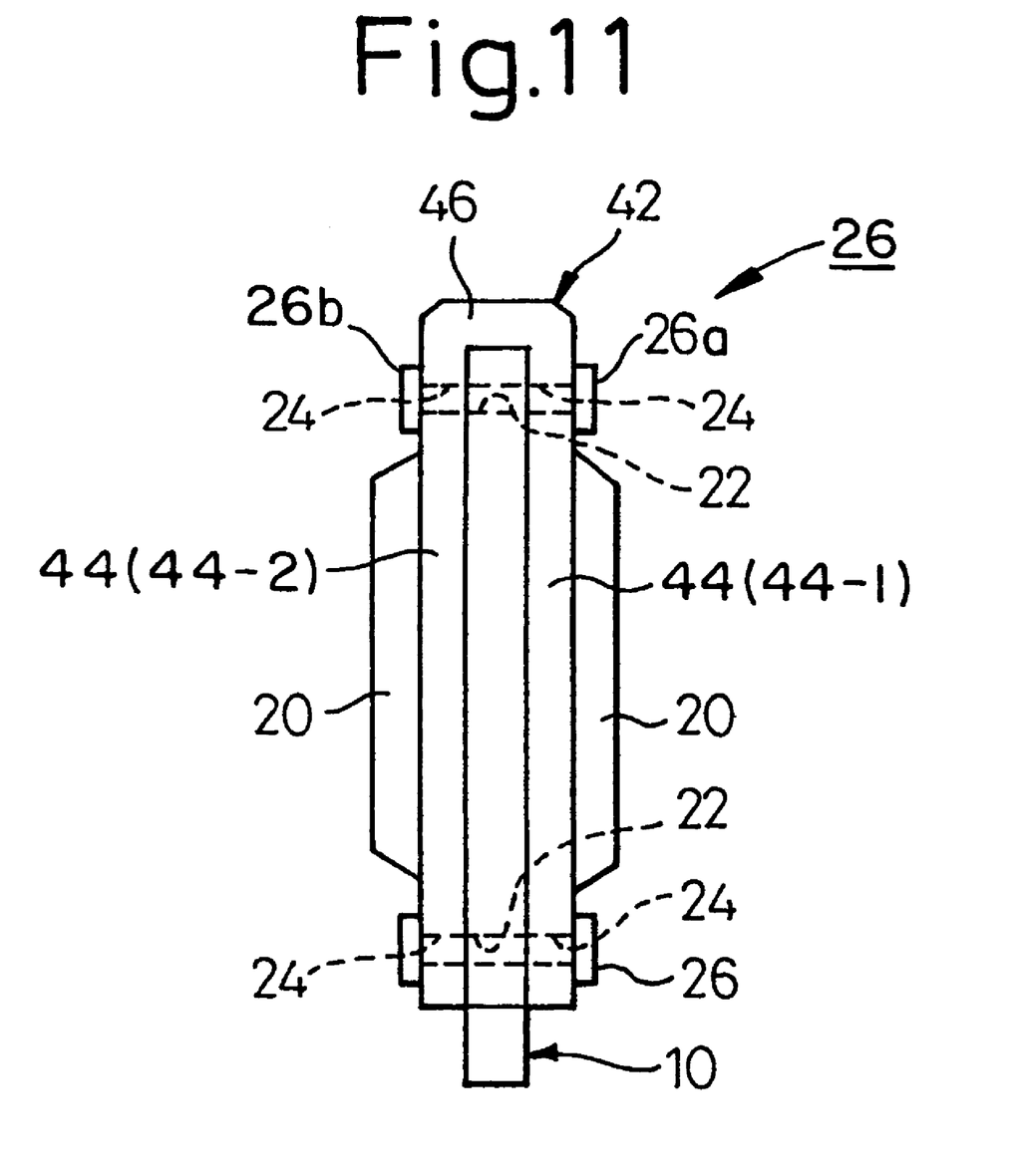
FIG. 11 is a side view of the memory module on which the heat sink shown in FIG. 10 is attached.

The steps for attaching the heat sink 42 to the memory module 10 will be described below.

First, the heat sink 42 is bent at the thin-walled portions A to have a U-shaped cross-section wherein the pair of metallic plates 44 are opposed to each other.

Next, the memory module 10 is sandwiched between the metallic plates 44.

Then, by applying pressure to the outer surface of the respective metallic plate 44, the inner surface of the respective metallic plate 44 is brought into close contact with the respective side of the circuit board 12 of the memory module 10 so that the through-holes 24 provided in the metallic plate 44 are aligned with the attachment holes 22 provided in the circuit board 12.

Finally, rivets 26 are inserted into the through-holes 24 aligned with the attachment holes 22 while positioning the memory module 10 by the metallic plates 44 so that the alignment of the through-hole 24 with the attachment hole 22 is not disturbed. By riveting, the heat sink 42 is secured as shown in FIG. 11, with the rivet head 26a engaging the outer surface of plate 44-1 and the distal end 26b thereof being enlarged to engage the outer surface of the plate 44-2 and secure the elements together.

As stated above, since the pair of metallic plates 44 are integrally coupled to be bendable to oppose to each other, at least the mis-alignment of the through-holes 24 between the pair of metallic plates 44 is avoidable. Therefore, it is sufficient to solely take care so that no shift occurs between the memory module 10 and the respective metallic plate 44, which facilitates the handling and improves the workability of the riveting operation in comparison with the prior art wherein three plate members must be separately positioned.

Figure 13:
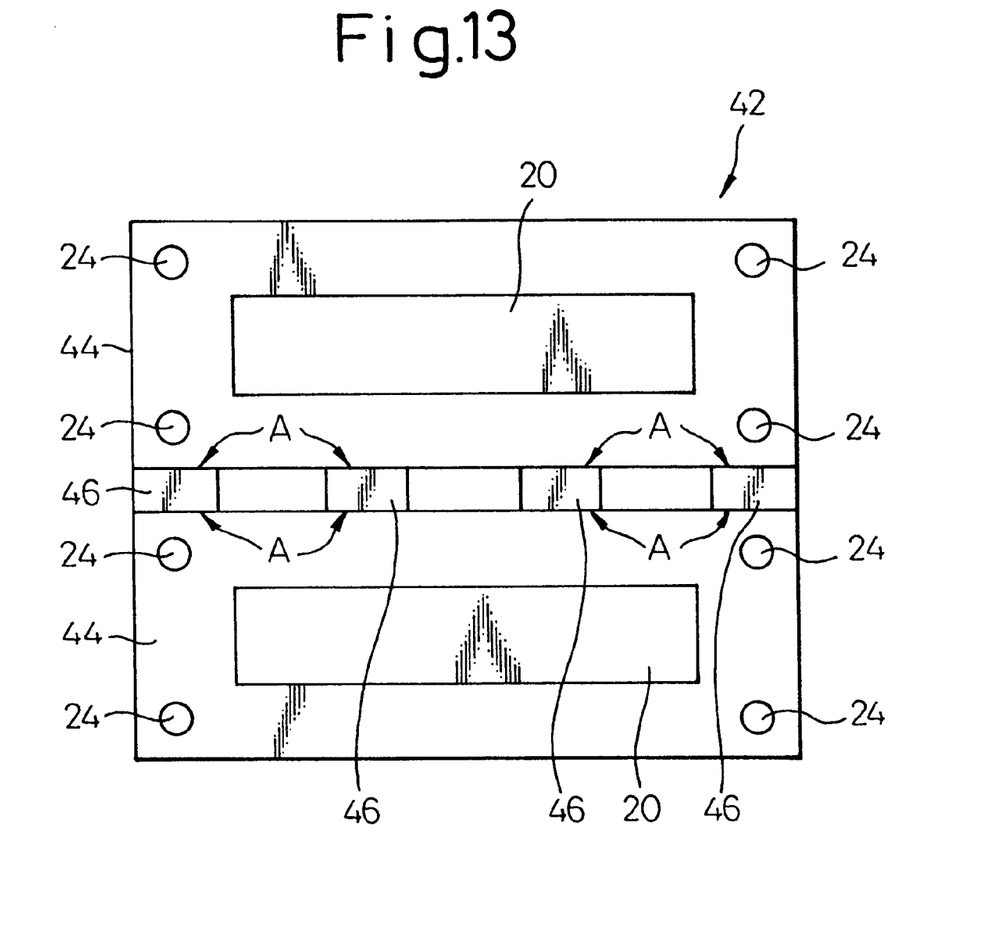
FIG. 13 is plan view illustrating another aspect of a joint of the fourth embodiment.

The joint portion 46 may be of a structure wherein one metallic plate 44 is coupled to the other metallic plate 44 all over the length of one edge thereof as shown in FIG. 10, or of a structure wherein they are partially coupled to each other as shown in FIG. 13.

While the present invention has been described with reference to the preferred embodiments, it should be noted that the present invention is not limited to the above-mentioned embodiments but includes various changes and modifications within a spirit of the present invention; for instance, although not illustrated, rivets may be press-fitted in advance into the through-holes in one metallic plate alternative to the tubular projections described above, and used as a positioning means for preventing the circuit board or the other metallic plate from being laterally shifted.

According to a heat sink for a semiconductor module of the present invention, since the tubular projections in one metallic plate are inserted into the attachment holes in the circuit board and the through-holes in the other metallic plate, the lateral shift is avoidable between the pair of metallic plates and the circuit board. In addition, since the metallic plates and the circuit board are fastened to each other only by hammering a projected tip end of the tubular projection passing through the circuit board and the other metallic plate to have a larger diameter, a troublesome riveting operation used in the prior art could be eliminated, wherein rivets are inserted one by one into individual holes while taking care so that the respective metallic plate is not shifted to the semiconductor module, whereby the process for the production thereof could be extremely simplified.

According to another embodiment of a heat sink for a semiconductor module, since the pair of metallic plates are identical in shape, they could be prepared by using the same die to lower the production cost.

According to a further embodiment of a heat sink for a semiconductor module, since the pair of metallic plates are integrally coupled to each other, the alignment of the through-holes at least between the respective metallic plates is always maintained. Therefore, it is sufficient to solely take care so that no shift occurs between the memory module and the respective metallic plate, which facilitates the handling and improves the workability of the riveting operation in comparison with the prior art wherein three plate members must be separately positioned.

Also, a semiconductor module to which the heat sink according to any one of these embodiments is attached could be produced at a lower cost due to its simple attachment structure.

What is claimed is:

1. A heat sink for a semiconductor module, comprising:

a pair of metallic plates between which a circuit board, having attachment holes, is to be disposed in such a manner that spaces are defined between said circuit board and said pair of metallic plates for accommodating one or more semiconductor elements or semiconductor devices mounted on said circuit board, when said pair of metallic plates are attached to said circuit board;

one of said metallic plates having through holes therein at positions corresponding to respective said attachment holes;

the other metallic plate having tubular projections extending therefrom at positions corresponding to said respective attachment holes, the tubular projections having a length larger than a sum of a thickness of said circuit board and a thickness of said one metallic plate;

said tubular projections being insertable into said corresponding attachment holes and said corresponding through holes and tip ends of said tubular projections being enlargable so as to firmly attach said pair of metallic plates to said circuit board; and a connecting portion integrally interconnecting said pair of metallic plates, the connecting portion having a width substantially the same as the thickness of said circuit board, said pair of metallic plates being bendable along respective, common edges of said pair of metallic plates and said connecting portion so as to be attached to said circuit board when disposed therebetween.

2. A heat sink as set forth in claim 1, wherein said common edges comprise thin portions at boundaries between, and relative to a thickness of, said connecting portion and said metallic plates, so that said pair of metallic plates can be easily bent along said thin portions relatively to the connecting portion and thereby be attached to said circuit board.

3. A heat sink adapted to be used for a semiconductor module, said heat sink comprising:

a pair of same or symmetrical metallic plates between which a circuit board, having at least a pair of attachment holes, is to be disposed in such a manner that spaces are defined between said circuit board and said pair of metallic plates for accommodating semiconductor elements or semiconductor devices mounted on said circuit board, when said pair of metallic plates are attached to said circuit board;

each of said metallic plates being provided at one position, corresponding to one of said pair of attachment holes, with a through hole and at another position, corresponding to the other attachment hole, with a tubular projection having a length larger than a sum of a thickness of said circuit board and a thickness of the metallic plate;

said tubular projections of the respective metallic plates being insertable into said corresponding attachment holes and said corresponding through holes of the respective other metallic plates and tip ends of said tubular projections being enlargeable so as to firmly attach said pair of metallic plates to said circuit board; and a connection portion integrally interconnecting said pair of metallic plates, the connecting portion having a width substantially the same as the thickness of said circuit board, said pair of metallic plates being bendable along respective, common edges of said pair of metallic plates and said connecting portion so as to be attached to said circuit board when disposed therebetween.

4. A heat sink as set forth in claim 3, wherein said common edges comprise thin portions at boundaries between, and relative to a thickness of, said connecting portion and said metallic plates, so that said pair of metallic plates can easily be bent along said thin portions relatively to the connecting portion and thereby be attached to said circuit board.

5. A heat sink adapted to be used for a semiconductor module, said heat sink comprising:

a pair of metallic plates between which a circuit board having attachment holes is to be disposed in such a manner that spaces are defined between said circuit board and said pair of metallic plates for accommodating one or more semiconductor elements or semiconductor devices mounted on said circuit board, when said pair of metallic plates are attached to said circuit board;

each of said metallic plates having through holes therein at positions corresponding to said attachment holes, the connecting portion having a width substantially the same as the thickness of said circuit board; and thin portions provided at respective boundaries between said connecting portion and said metallic plates, so that said pair of metallic plates can easily be bent along said thin portions relatively to the connection portion and thereby be attached to said circuit board.

6. A semiconductor module comprising:

a circuit board provided with a plurality of attachment holes;

semiconductor elements or semiconductor devices mounted on said circuit board;

a pair of metallic plates between which said circuit board is disposed in such a manner that spaces are defined between said circuit board and said pair of metallic plates for accommodating said semiconductor elements or semiconductor devices, when said pair of metallic plates are attached to said circuit board;

one of said metallic plates provided at positions corresponding to said attachment holes with through holes;

the other metallic plate provided at positions corresponding to said attachment holes with tubular projections having a length larger than a sum of a thickness of said circuit board and a thickness of said one metallic plate;

said tubular projections being inserted into and extending through said attachment holes and said through holes and tip ends of said tubular projections being enlarged to firmly attach said pair of metallic plates to said circuit board; and a connection portion integrally interconnecting said pair of metallic plates, the connecting portion having a width substantially same as the thickness of said circuit board, said pair of metallic plates being bendable along respective, common edges of said pair of metallic plates and said connecting portion so as to be attached to said circuit board when disposed therebetween.

7. A semiconductor module as set forth in claim 6, wherein said common edges comprise thin portions at respective boundaries between, and relative to the thicknesses of, said connecting portion and said metallic plates, so that said pair of metallic plates can easily be bent along said thin portions relatively to the connecting portion and thereby be attached to said circuit board.

8. A semiconductor module comprising:

a circuit board provided with a plurality of attachment holes;

semiconductor elements or semiconductor devices mounted on said circuit board;

a pair of symmetrical metallic plates between which a circuit board, having at least a pair of attachment holes, is disposed in such a manner that spaces are defined between said circuit board and said pair of metallic plates for accommodating semiconductor elements or semiconductor devices mounted on said circuit board, when said pair of metallic plates are attached to said circuit board;

each of said metallic plates provided, at a position corresponding to one of said attachment holes, with a through hole and at a position, corresponding to the other attachment hole, with a tubular projection having a length larger than a sum of a thickness of said circuit board and a thickness of the metallic plate;

said tubular projections of the respective metallic plates capable of insertable into said corresponding attachment holes and said corresponding through holes of the respective other metallic plate and tip ends of said tubular projections capable of being enlarged so as to firmly attach said pair of metallic plates to said circuit board; and a connection portion integrally interconnecting said pair of metallic plates, the connecting portion having a width substantially the same as the thickness of said circuit board, said pair of metallic plates being bendable along respective, common edges of said pair of metallic plates and said connecting portion so as to be attached to said circuit board when disposed therebetween.

9. A semiconductor module as set forth in claim 8, wherein said common edges comprise thin portions at respective boundaries between, and relative to the thicknesses of, said connecting portion and said metallic plates, so that said pair of metallic plates can easily be bent along said thin portions relatively to the connection portion and thereby be attached to said circuit board.

10. A semiconductor module comprising:

a circuit board provided with a plurality of attachment holes;

semiconductor elements or semiconductor devices mounted on said circuit board;

a pair of metallic plates, between which a circuit board having attachment holes is to be disposed, in such a manner that spaces are defined between said circuit board and said pair of metallic plates for accommodating semiconductor elements or semiconductor devices mounted on said circuit board, when said pair of metallic plates are attached to said circuit board;

each of said metallic plates provided at positions corresponding to said attachment holes with through holes;

said pair of metallic plates integrally connected to each other by means of a connecting portion having a width substantially the same as a thickness of said circuit board; and thin portions at respective boundaries between, and relatively to the thicknesses of, said connecting portion and said metallic plates, so that said pair of metallic plates can easily be bent along said thin portions relatively to the connecting portion and thereby be attached to be attached to said circuit board.

11. A semiconductor module as set forth in claim 10, further comprising:

rivets extending through the respective through holes in the pair of metal plates and the corresponding attachment holes, each rivet having a head engaging an outer main surface of one metallic plate and a distal end extending through a corresponding through hole in the respective, other metallic plate of the pair and the distal end being enlarged to secure the metallic plates to said circuit board.

* * * * *